United States Patent
Kagaya et al.

(10) Patent No.: US 9,822,009 B2
(45) Date of Patent: Nov. 21, 2017

(54) METHOD FOR PRODUCING GRAPHENE

(71) Applicant: TOKYO ELECTRON LIMITED, Tokyo (JP)

(72) Inventors: Munehito Kagaya, Tokyo (JP); Takashi Matsumoto, Nirasaki (JP); Daisuke Nishide, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/947,659

(22) Filed: Nov. 20, 2015

(65) Prior Publication Data

US 2016/0075560 A1    Mar. 17, 2016

Related U.S. Application Data

(63) Continuation of application No. PCT/JP2014/064564, filed on May 27, 2014.

(30) Foreign Application Priority Data

May 29, 2013    (JP) ................. 2013-112928

(51) Int. Cl.
| | |
|---|---|
| *C01B 31/04* | (2006.01) |
| *C23C 16/26* | (2006.01) |
| *C23C 16/02* | (2006.01) |
| *C23C 16/452* | (2006.01) |
| *C23C 16/455* | (2006.01) |
| *C01B 32/186* | (2017.01) |

(52) U.S. Cl.
CPC ........ *C01B 31/0453* (2013.01); *C01B 32/186* (2017.08); *C23C 16/0281* (2013.01); *C23C 16/26* (2013.01); *C23C 16/452* (2013.01); *C23C 16/45565* (2013.01); *C23C 16/45574* (2013.01); *C01B 2204/32* (2013.01)

(58) Field of Classification Search
None
See application file for complete search history.

(56) References Cited

U.S. PATENT DOCUMENTS

| | | | |
|---|---|---|---|
| 2011/0033688 A1* | 2/2011 | Veerasamy | C30B 25/02 428/220 |
| 2011/0091647 A1* | 4/2011 | Colombo | B82Y 30/00 427/249.1 |
| 2012/0021249 A1* | 1/2012 | Shin | B82Y 30/00 428/688 |

FOREIGN PATENT DOCUMENTS

| | | |
|---|---|---|
| JP | 2004-277201 A | 10/2001 |
| JP | 2010-212619 A | 9/2010 |

OTHER PUBLICATIONS

International Search Report dated Aug. 26, 2014 issued in International Application No. PCT/JP2014/064564.

(Continued)

*Primary Examiner* — Joseph Miller, Jr.
(74) *Attorney, Agent, or Firm* — Nath, Goldberg & Meyer; Jerald L. Meyer; Annie Kock

(57) ABSTRACT

A graphene producing method which is capable of increasing a size of each domain of graphene. A plasma CVD film formation device that activates a catalyst metal layer formed on a wafer; modifies the same into an activated catalyst metal layer; decomposes a $C_2H_4$ gas as a low reactivity carbon-containing gas by plasma in a space that opposes the wafer; and decomposes a $C_2H_2$ gas as a high reactivity carbon-containing gas by heat in the space.

4 Claims, 7 Drawing Sheets

(56) References Cited

OTHER PUBLICATIONS

Naeemi, et al., "Conductance Modeling for Graphene Nanoribbon (GNR) Interconnects", IEEE Electron Device Letters, vol. 28, No. 5, pp. 428-431, May 2007.
Yamazaki, et al., "Low-Temperature Graphene Growth Originating at Crystalline Facets of Catalytic Metal", Applied Physics Express, vol. 5, Jan. 2012.

\* cited by examiner

METHOD FOR PRODUCING GRAPHENE

CROSS-REFERENCE TO RELATED APPLICATIONS

This application is a Continuation Application of PCT International Application No. PCT/JP2014/064564, filed May 27, 2014, which claimed the benefit of Japanese Patent Application No. 2013-112928, filed May 29, 2013, the entire content of each of which is hereby incorporated by reference.

TECHNICAL FIELD

The present disclosure relates to a graphene producing method, which can be appropriately used in a wiring film of a three-dimensional stacked memory.

BACKGROUND

Conventionally, a metal, e.g., copper (Cu), is used for a wiring of a three-dimensional (3D) stacked memory. In an ultra-fine wiring structure formed of a metal wiring material such as Cu, conduction electrons are intensely affected by an inelastic scattering in an interface due to a fine line effect, resulting in a problem that a wiring has a high resistance.

Meanwhile, graphene has a very long mean free path or a high mobility. When the grapheme is applied to a fine wiring structure, a low resistance wiring exceeding Cu can be implemented. Thus, in a next-generation 3D stacked memory required to realize a finer stacked structure or wiring structure, the use of graphene, instead of Cu, in a wiring film is under consideration.

A chemical vapor deposition (CVD) (e.g., thermal CVD or plasma CVD) method which is a typical graphene producing method, includes covering a surface of a substrate with a catalytic metal layer, activating the catalytic metal layer, dissolving carbon atoms decomposed from a raw material gas into the activated catalytic metal layer, and recrystallizing the carbon atoms. That is to say, the CVD method is capable of easily producing graphene on a substrate having a relatively large area, thus being easily adapted to an existing semiconductor device formation process.

In the thermal CVD of the CVD method, it is necessary to heat a substrate to about 1,000 degrees C. so as to thermally decompose a raw material gas, thus causing a concern that another wiring film or insulating film in the 3D stacked memory is modified. As such, as it now stands, the plasma CVD which decomposes the raw material gas by plasma and heats the substrate at a relatively low temperature, e.g., 600 degrees C. or lower, is mainly used. In the plasma CVD method, for example, a hydrocarbon-based gas is used as the raw material gas. Plasma is generated from the hydrocarbon-based gas, and carbon radicals in the generated plasma are dissolved into a catalytic metal layer.

However, when graphene is used for a wiring film, it is important to increase the size of the domain (mass) of graphene as a crystalline body in order to enhance conductivity of graphene. In particular, it was confirmed that, in a low temperature growth mode in which graphene is produced at 600 degrees C. or lower, domains of graphene grow from facets as a specific miller index plane in a crystal of a catalytic metal.

In each facet, cores (nuclei) of graphene are generated at an initial production stage of graphene. Since the cores are starting points at which grapheme grows, a decrease in the number of facets decreases the number of the growth starting points of grapheme. As a result, it is possible to secure an expansion space of each domain, thus increasing a size of each domain.

However, the decrease in the number of facets and the number of the growth starting points of graphene requires a period of time during which the entire grapheme is grown. As such, an amount of heat applied to the graphene while being produced is increased so that a surface roughness of grapheme is increased, thus decreasing the expansion space of each domain. This fails to increase the size of each domain.

Meanwhile, if a high reactivity hydrocarbon-based gas is used to accelerate the growth of the entire graphene, cores of graphene are generated even in areas other than each facet of a catalytic metal layer at the initial production stage of graphene, increasing the number of cores. As a result, the number of generated domains is increased, which makes it impossible to secure the expansion space of each domain, decreasing the size of each domain.

SUMMARY

The present disclosure provides some embodiments of a graphene producing method, which are capable of increasing a size of each domain of graphene.

According to one embodiment of the present disclosure, there is provided a graphene producing method which includes: activating a catalytic metal layer formed on a substrate; decomposing a low reactivity carbon-containing gas in a space that faces the substrate; and decomposing a high reactivity carbon-containing gas in the space that faces the substrate.

In some embodiments, in decomposing the low reactivity carbon-containing gas, the low reactivity carbon-containing gas is decomposed by plasma.

In some embodiments, in decomposing the high reactivity carbon-containing gas, the high reactivity carbon-containing gas is decomposed by heat.

In some embodiments, the low reactivity carbon-containing gas includes at least one of an ethylene gas (a $C_2H_4$ gas), a chain-type saturated hydrocarbon gas (a methane gas, an ethane gas, or a propane gas), a chain-type unsaturated hydrocarbon (double bond) gas (a propylene gas), a cyclic hydrocarbon gas, an aromatic hydrocarbon gas, a gas of phenols, a gas of alcohols, and a gas of ethers.

In some embodiments, the high reactivity carbon-containing gas includes at least an acetylene gas (a $C_2H_2$ gas).

According to the present disclosure, since a low reactivity carbon-containing gas is first decomposed in a space that faces the substrate, and subsequently, a high reactivity carbon-containing gas is decomposed in the space that faces the substrate, it is possible to decrease the number of cores of graphene which is formed on a surface of the substrate. Further, it is possible to grow the graphene from the decreased number of the cores of the graphene in a short period of time. Thus, it is possible to increase a size of each domain of graphene.

DETAILED DESCRIPTION

Embodiments of the present disclosure will now be described in detail with reference to the accompanying drawings.

Figure 1:
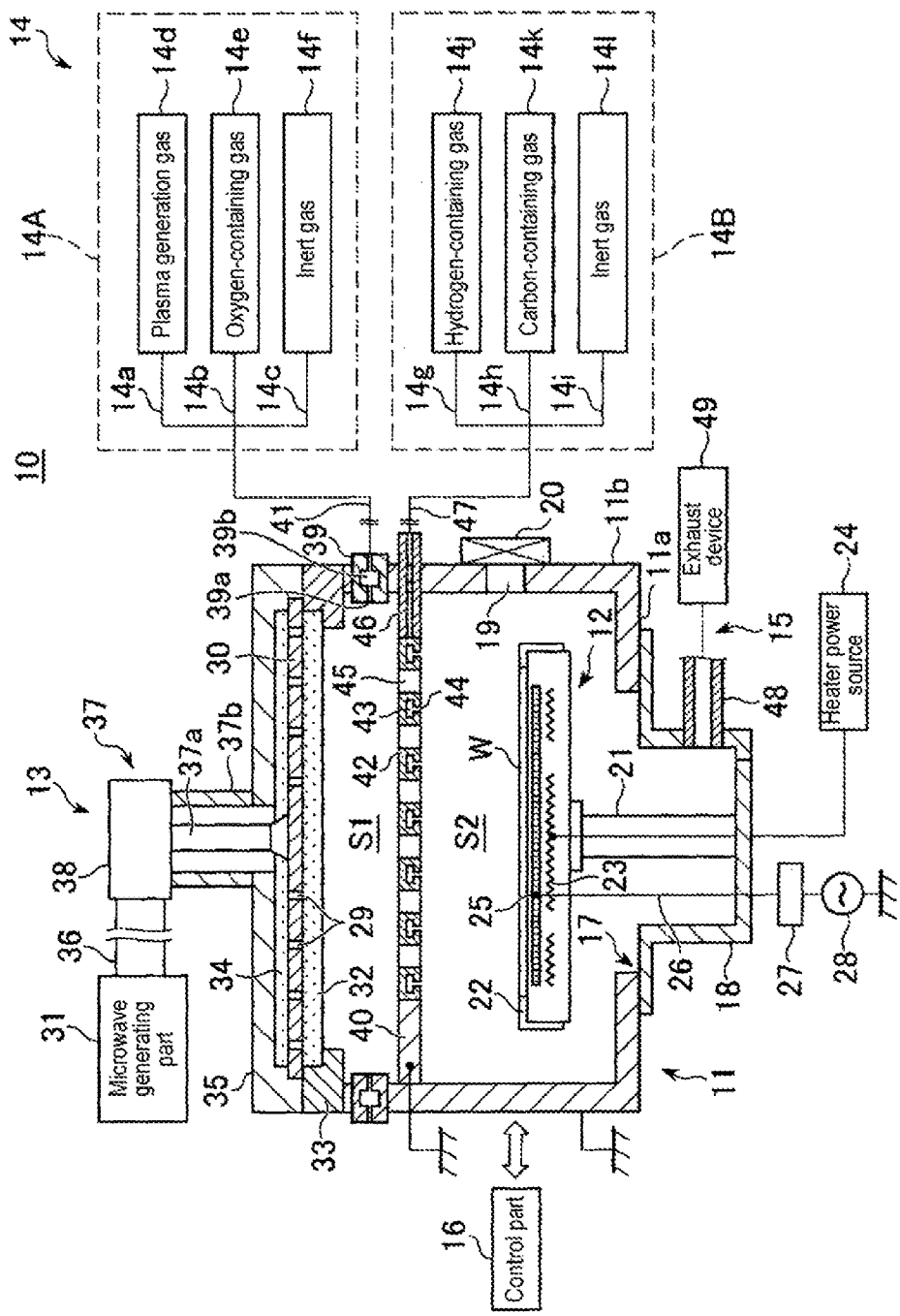
FIG. 1 is a cross-sectional view schematically showing a configuration of a plasma CVD film-forming device, which is used in a graphene producing method according to an embodiment of the present disclosure.

FIG. 1 is a cross-sectional view schematically showing a configuration of a plasma CVD film-forming device used in a graphene producing method according to an embodiment of the present disclosure.

In FIG. 1, a plasma CVD film-forming device 10 includes a substantially cylindrical chamber 11 which is hermetically sealed, a mounting stand 12 installed within the chamber 11 and configured to mount a semiconductor wafer (hereinafter, simply referred to as "wafer") W used as a target substrate thereon, a microwave introducing part 13 configured to introduce microwaves into the chamber 11, a gas supply part 14 configured to supply gas into the chamber 11, an exhaust part 15 configured to exhaust the interior of the chamber 11, and a control part 16 configured to control respective components of the plasma CVD film-forming device 10.

A circular opening 17 is formed in a substantially central portion of a lower wall 11a of the chamber 11. An exhaust chamber 18, which communicates with the interior of the chamber 11 through the opening 17 and protrudes downward in the drawing, is installed in the lower wall 11a. A loading/unloading port 19 through which the wafer W is loaded into and unloaded from the chamber 11 and a gate valve 20 configured to open and close the loading/unloading port 19 are installed in a sidewall 11b of the chamber 11.

The mounting stand 12, which is made of, e.g., an AlN ceramic, is supported by a cylindrical ceramic post 21 which extends upward from a lower central portion of the exhaust chamber 18. A guide ring 22 configured to guide the wafer W is installed in an outer periphery portion of the mounting stand 12. Lifting pins (not shown) configured to move the wafer W up and down is installed within the mounting stand 12. The lifting pins protrude from an upper surface of the mounting stand 12 such that the wafer W is separated from the mounting stand 12.

A resistance heating type heater 23 is embedded within the mounting stand 12. The heater 23 is connected to a heater power supply 24. The heater power supply 24 supplies power to the heater 23 to heat the wafer W mounted on the mounting stand 12. Further, a thermocouple (not shown) is inserted into the mounting stand 12 to measure a temperature of the wafer W. The heater 23 controls the temperature of the wafer W to fall within a range of 50 to 1,000 degrees C. Also, in the following description, unless specifically mentioned otherwise, the temperature of the wafer W does not mean a setting temperature of the heater 23 but means a temperature measured by the thermocouple.

In addition, above the heater 23 in the mounting stand 12, a lower electrode 25 is embedded between the heater 23 and the upper surface of the mounting stand 12. The lower electrode 25 is coupled to a radio-frequency (RF) power supply 28 via a matching box 27 through a power supply line 26. The RF power supply 28 is configured to apply a high frequency bias (an RF bias voltage). The lower electrode 25 applies the RF bias voltage to the wafer W based on an RF power supplied from the RF power supply 28.

In some embodiments, an example of a material of the lower electrode 25 may include a material having a thermal expansion coefficient equal to that of ceramic such as AlN which is a material of the mounting stand 12. As an example, a conductive material such as molybdenum or tungsten may be used as the material of the lower electrode 25. The lower electrode 25 is formed to have, e.g., a mesh pattern, a grid pattern, or a vortex pattern. In some embodiments, a size of the lower electrode 25 may be equal to that of the wafer at least, or slightly greater than that of the wafer W (e.g., approximately 1 to 5 mm greater than a diameter of the wafer W).

The microwave introducing part 13 includes a planar antenna 30 installed above the chamber 11 and having a plurality of microwave radiation holes 29 formed therein, a microwave generating part 31 configured to generate microwaves, a dielectric window 32 made of a dielectric, a frame-shaped member 33 installed above the chamber 11 and below the planar antenna 30, a dielectric plate 34 formed of a dielectric configured to adjust a wavelength of the microwave, and a cover member 35 configured to cover the planar antenna 30 and the dielectric plate 34. Further, the microwave introducing part 13 includes a waveguide 36 and a coaxial waveguide 37 which guide the microwave generated from the microwave generating part 31 toward the planar antenna 30, and a mode converter 38 installed between the waveguide 36 and the coaxial waveguide 37.

The dielectric window 32 which transmits the microwave therethrough is formed of quartz or ceramic such as $Al_2O_3$ or MN. The dielectric window 32 is supported by the frame-shaped member 33. A seal member (not shown) such as an O-ring is disposed between the dielectric window 32 and the frame-shaped member 33 such that the interior of the chamber 11 is kept air-tightly.

The planar antenna 30 is formed in, e.g., a disc shape, and is configured by an electrically conductive member such as a copper plate whose surface is plated with gold or silver, an aluminum plate, a nickel plate, or an alloy plate thereof. The planar antenna 30 is arranged above the dielectric window 32 and is installed substantially parallel to the upper surface (mounting surface) of the mounting stand 12 on which the wafer W is mounted. The planar antenna 30 is fixed to an upper end of the frame-shaped member 33. Each of the microwave radiation holes 29 is formed to have a rectangular hole (slot shape) and are dispersively arranged in the planar antenna 30 according to a predetermined pattern. For example, two adjacent microwave radiation holes 29 are combined as a pair to maintain a predetermined position relation (for example, in a T-shape). The paired microwave radiation holes 29 are arranged in a concentric circular pattern, a spiral pattern, a radial pattern, or the like. A length of each of the microwave radiation holes 29 and an arrangement interval therebetween are determined depending on a wavelength of the microwave.

The dielectric plate 34 having a dielectric constant greater than that of vacuum is installed on an upper surface of the planar antenna 30. In order to correspond to a lengthened wavelength of microwave in vacuum, the dielectric plate 34 shortens the wavelength of the microwave. An example of a material of the dielectric plate 34 may include quartz, a polytetrafluoroethylene resin, or a polyimide resin.

Further, the cover member 35 is made of a metal material such as aluminum or stainless steel. A substantially center of an upper surface of the cover member 35 is connected to one end of the coaxial waveguide 37. The coaxial waveguide 37 includes an inner conductor 37a extending from the center of the planar antenna 30 upwardly and an outer conductor 37b surrounding the inner conductor 37a. The other end of the coaxial waveguide 37 is connected to the mode converter 38. The mode converter 38 is coupled to the microwave generating part 31 through the waveguide 36. The mode converter 38 converts the microwave propagating in a TE mode through the waveguide 36 into a TEM mode.

The gas supply part 14 includes a shower ring 39 installed in a ring shape along an inner wall of the chamber 11 and a shower plate 40 installed below the shower ring 39 to vertically partition an internal space of the chamber 11.

The shower ring 39 includes a gas discharge hole 39a through which a gas is introduced into the internal space of the chamber 11 and a gas flow channel 39b which is in communication with the discharge hole 39a. The gas flow channel 39b is coupled to a first gas supply part 14A through a gas supply path 41. The first gas supply part 14A includes three branch paths 14a, 14b, and 14c which are branched from the gas supply path 41. The branch path 14a is connected to a plasma generation gas supply source 14d configured to supply a plasma generation gas, the branch path 14b is connected to an oxygen-containing gas supply source 14e configured to supply an oxygen-containing gas, and the branch path 14c is connected to an inert gas supply source 14f configured to supply an inert gas. A mass flow controller (not shown) and a valve (not shown) are installed in each of the branch paths 14a, 14b, and 14c.

An example of the plasma generation gas may include a noble gas. An example of the noble gas may include gas such as argon (Ar), neon (Ne), krypton (Kr), xenon (Xe), or helium (He). Among these, the Ar gas can stably generate plasma, and in some embodiments, the Ar gas may be used as the noble gas. An example of the oxygen-containing gas may include gas such as $O_2$, $H_2O$, $O_3$, and $N_2O$. An example of the inert gas may include an $N_2$ gas. The inert gas supplied from the inert gas supply source 14f is used as, for example, a purge gas or a gas for adjusting an internal pressure of the chamber 11.

The shower plate 40 includes a gas distribution member (grid) 42 which is made of, e.g., aluminum and is formed in a grid pattern when seen from a plan view. The grid 42 includes a gas flow channel 43 formed therein and a plurality of gas discharge holes 44 opened to face the mounting stand 12 from the gas flow channel 43. The grid 42 further includes a plurality of through holes 45. The gas flow channel 43 of the shower plate 40 is connected to a gas supply pipe 46 formed to pass through the sidewall of the chamber 11. The gas supply pipe 46 is coupled to a second gas supply part 14B through a gas supply path 47. The second gas supply part 14B includes three branch paths 14b, 14h, and 14i which are branched from the gas supply path 47. The branch path 14g is connected to a hydrogen-containing gas supply source 14j configured to supply a hydrogen-containing gas. The branch path 14h is connected to a carbon-containing gas supply source 14k configured to supply a carbon-containing gas used as the raw material of graphene. The branch path 14i is connected to an inert gas supply source 14l configured to supply an inert gas. Similarly, a mass flow controller (not shown) and a valve (not shown) are installed in each of the branch paths 14g, 14h, and 14i.

An example of the hydrogen-containing gas may include gas such as $H_2$ and $NH_3$. An example of the carbon-containing gas may include: a hydrocarbon gas such as ethylene ($C_2H_4$), methane ($CH_4$), ethane ($C_2H_6$), propane ($C_3H_8$), propylene ($C_3H_6$) or acetylene ($C_2H_2$); alcohols such as methanol ($CH_3OH$) or ethanol ($C_2H_5OH$); ethers; or aromatic hydrocarbon. An example of the inert gas may include an $N_2$ gas. The inert gas supplied from the inert gas supply source 14l is used as, for example, a purge gas or a carrier gas.

The exhaust part 15 includes the exhaust chamber 18, an exhaust pipe 48 opened in a lateral surface of the exhaust chamber 18, and an exhaust device 49 connected to the exhaust pipe 48. The exhaust device 49 is provided with a high speed vacuum pump such as a turbo molecular pump. The exhaust device 49 of the exhaust part 15 is operated to uniformly flow an internal gas of the chamber 11 into an internal space of the exhaust chamber 18, or to exhaust the internal gas inside the internal space through the exhaust pipe 48 to the exterior. Thus, it is possible to rapidly decompress the interior of the chamber 11 up to, e.g., 0.133 Pa.

In the plasma CVD film-forming device 10, the plasma generation gas is introduced into a space S1 defined between the dielectric window 32 through which the microwave is introduced and the shower plate 40 through the shower ring 39 within the chamber 11, thus generating plasma inside the space S1. Further, in a space S2 defined between the shower plate 40 and the mounting stand 12, the carbon-containing gas introduced through the shower plate 40 and the plasma generated inside the space S1 are mixed. The plasma mixed thus spreads carbon radicals of carbon plasma generated from the carbon-containing gas toward the wafer W mounted on the mounting stand 12.

Figure 2:
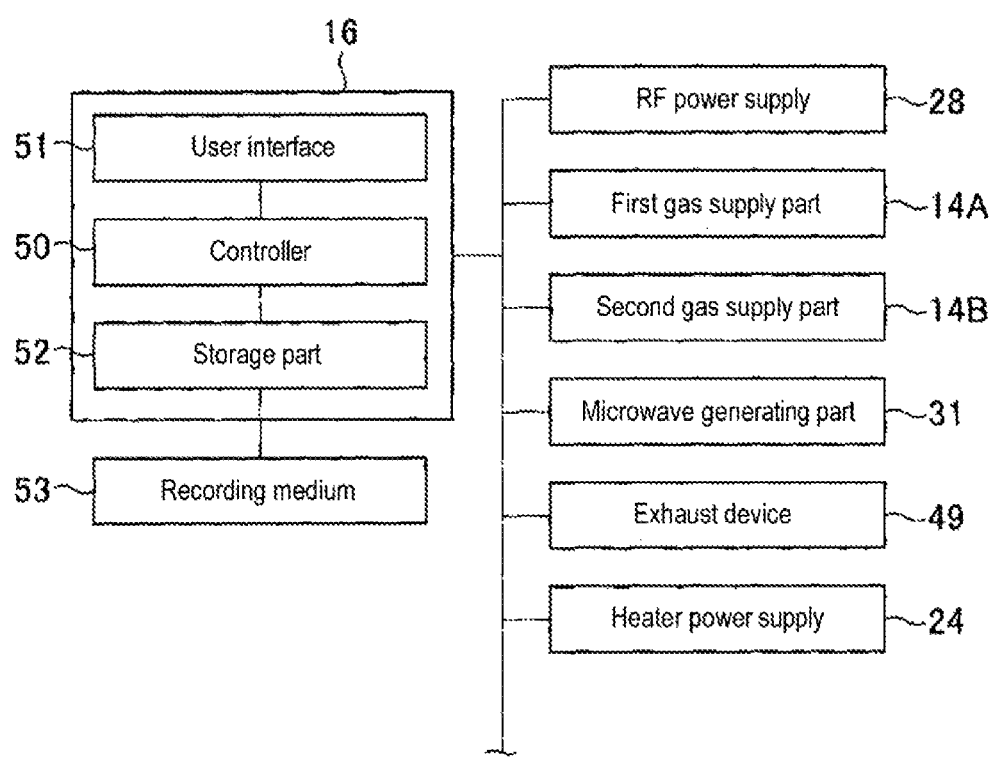
FIG. 2 is a block diagram schematically showing a configuration of a control part of FIG. 1.

The control part 16 is a module controller configured to control operations of the respective components of the plasma CVD film-forming device 10. The control part 16 is typically a computer. For example, as shown in FIG. 2, the control part 16 includes a controller 50 provided with a CPU, a user interface 51 connected to the controller 50, and a storage part 52.

The controller 50 controls the respective components of the plasma CVD film-forming device 10 (for example, the RF power supply 28 configured to apply the bias voltage, the heater power supply 24, the first gas supply part 14A, the second gas supply part 14B, the microwave generating part 31, the exhaust device 49, and the like) associated with various process conditions such as a temperature, a pressure, a gas flow rate, a microwave output, and an RF output for bias voltage application and the like.

The user interface 51 includes a keyboard or a touch panel through which an operator performs a command input operation or other operations to operate the plasma CVD film-forming device 10, a display which visually displays an operating situation of the plasma CVD film-forming device 10, and the like. Further, the storage part 52 stores recipes in which control programs (software) and process condition data for executing, under the control of the controller 50, various processes performed in the plasma CVD film-forming device 10.

Figure 6:
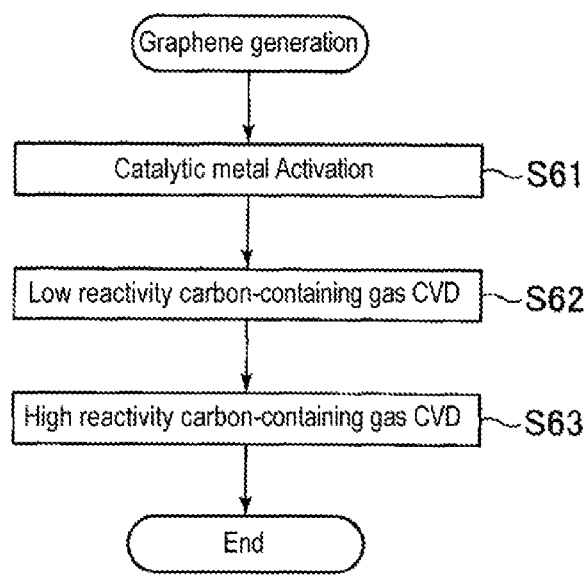
FIG. 6 is a flowchart showing a graphene producing method according to an embodiment of the present disclosure.

In addition, the control part 16 retrieves a certain recipe from the storage part 52 in response to an instruction or the like provided from the user interface 51, and controls the controller 50 to execute the retrieved recipe. At this time, a desired process, for example, a process (which will be described later) corresponding to the graphene producing method of FIG. 6 is performed within the chamber 11 of the plasma CVD film-forming device 10.

In some embodiments, the recipes in which the control programs, the processing condition data or the like are stored, may be stored in a computer-readable recording medium 53. An example of the recording medium 53 may include a CD-ROM, a hard disk, a flexible disk, or a flash memory. In some embodiments, the recipes may be transmitted from other devices through, e.g., a dedicated line.

In the plasma CVD film-forming device 10, the microwave is introduced into the chamber 11 by the planar antenna 30 such that a microwave-excited plasma having high density and a low electron temperature is generated. Specifically, in the plasma CVD film-forming device 10, the microwave-excited plasma having a density ranging from $1 \times 10^{10}$ to $5 \times 10^{12}/cm^3$ and an electron temperature ranging from 0.7 to 2 eV is generated within the chamber 11.

Figure 3A:
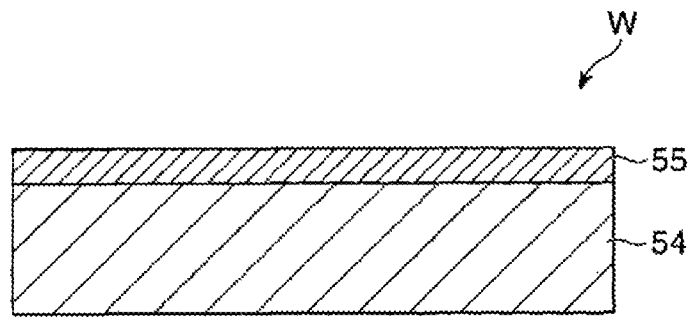
FIGS. 3A to 3C are views showing a process of a general graphene producing method performed in the plasma CVD film-forming device.
Figure 3B:
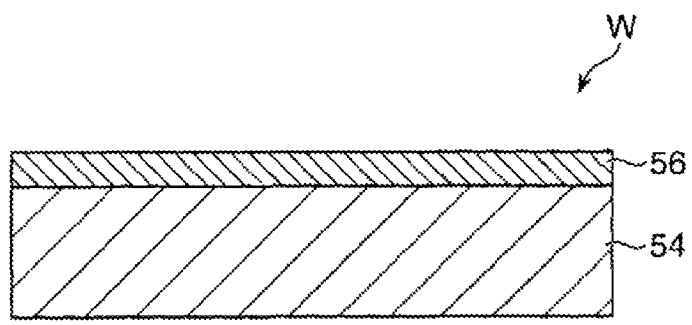
Figure 3C:
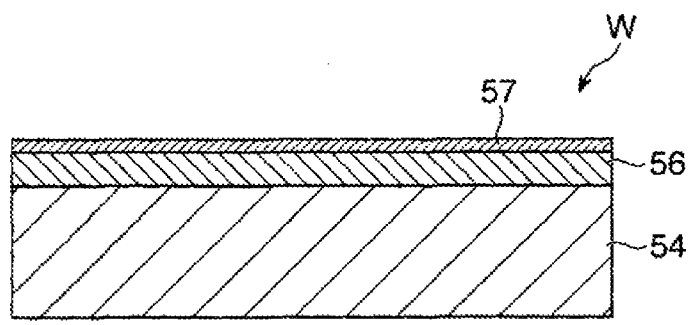

FIGS. 3A to 3C are views showing a process of a general graphene producing method performed in the plasma CVD film-forming device 10.

First, the wafer W having a catalytic metal layer 55 stacked on a silicon substrate 54 is prepared (FIG. 3A). Thereafter, a surface of the catalytic metal layer 55 is reduced to activate the catalytic metal layer 55 such that the catalytic metal layer 55 is modified into an activated catalytic metal layer 56 (FIG. 3B).

Subsequently, the carbon-containing gas is decomposed by heat or plasma such that carbon atoms are dissolved into the activated catalytic metal layer 56. The carbon atoms are recrystallized to produce graphene 57 on the activated catalytic metal layer 56 (FIG. 3C).

Figure 4A:
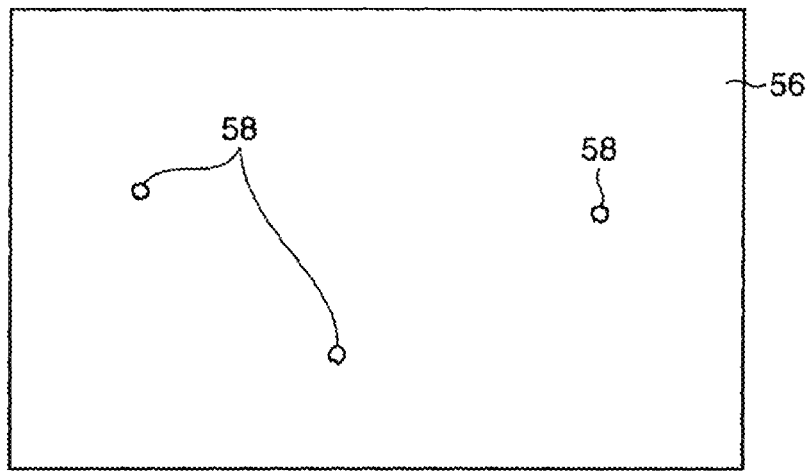
FIGS. 4A and 4B are views showing growth states of graphene when the number of facets is decreased in an activated catalytic metal layer.
Figure 4B:
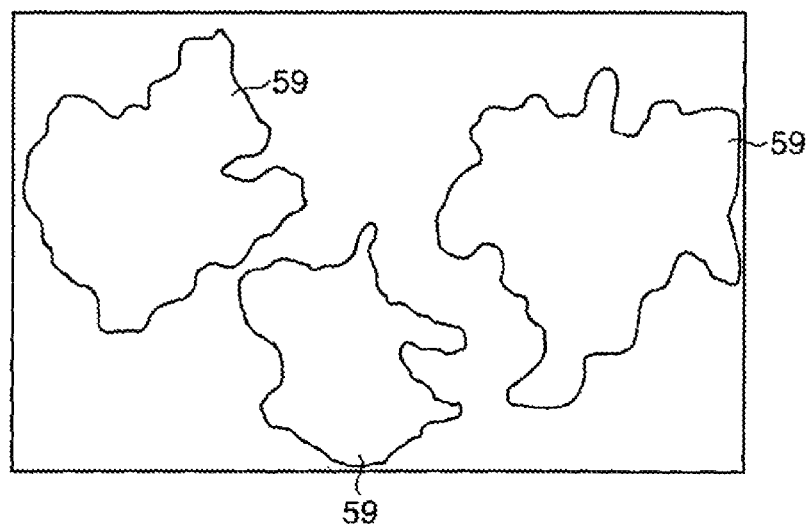

As mentioned above, the graphene 57 is grown from crystalline facets of the activated catalytic metal layer 56. When the graphene 57 is produced using only a low reactivity hydrocarbon gas, e.g., the $C_2H_4$ gas, since the $C_2H_4$ gas has a low decomposition efficiency, the number of cores 58 of the produced graphene 57 is decreased and a growth rate of the graphene 57 itself is also lowered. That is to say, this requires a period of time during which the entire graphene 57 grows. On this account, an amount of heat applied to the graphene 57 during the production of the graphene 57 is increased, thereby increasing a surface roughness of the graphene 57. As a result, an expansion space of each domain 59 is narrowed so that a size of each domain 59 is not greatly increased (FIG. 4B).

Figure 5A:
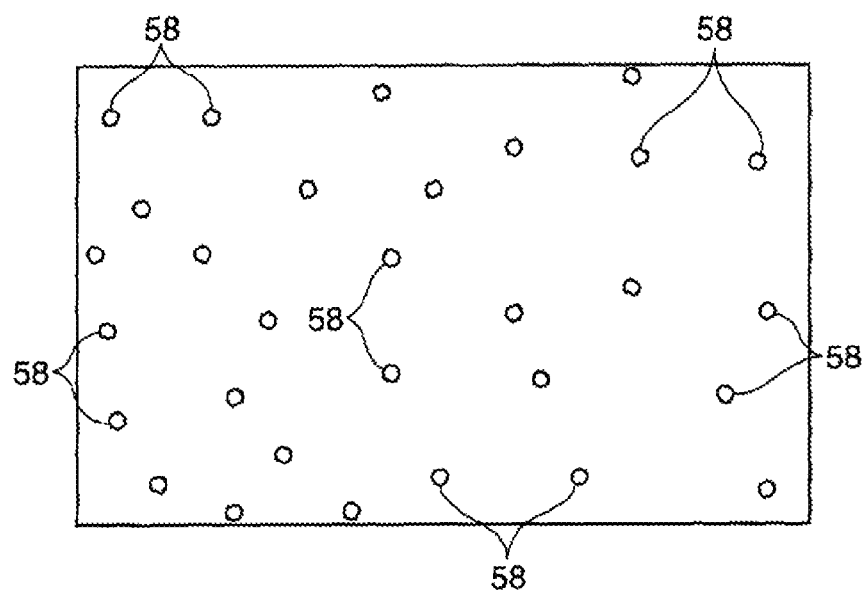
FIGS. 5A and 5B are views showing growth states of graphene when a high reactivity carbon-containing gas is used.
Figure 5B:
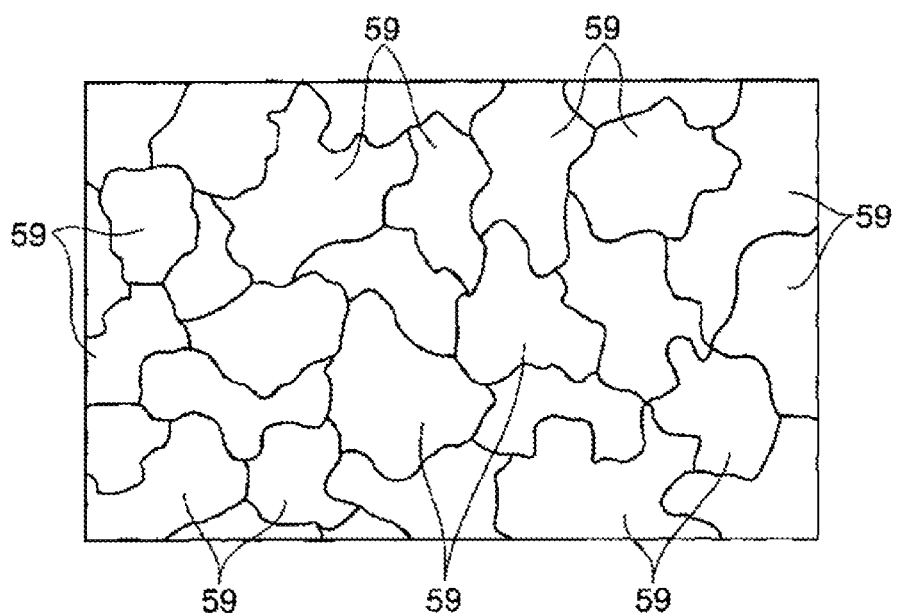

Meanwhile, when the graphene 57 is produced using a high reactivity carbon-containing gas in order to accelerate the growth of the entire graphene 57, a large number of the cores 58 of the graphene 57 are generated in areas other than the facets of the activated catalytic metal layer 56 at an initial production stage of the graphene 57. As a result, as shown in FIG. 5A, the number of the domains 59 of the produced graphene 57 is increased, which makes it difficult to secure the expansion space of each of the domains 59, thus reducing a size of each of the domains 59 (FIG. 5B).

In order to cope with this, in the graphene producing method according to the embodiment of the present disclosure, a graphene producing process is divided into two steps (a low reactivity carbon-containing gas CVD step S62 and a high reactivity carbon-containing gas CVD step S63, which will be described later).

Figure 7A:
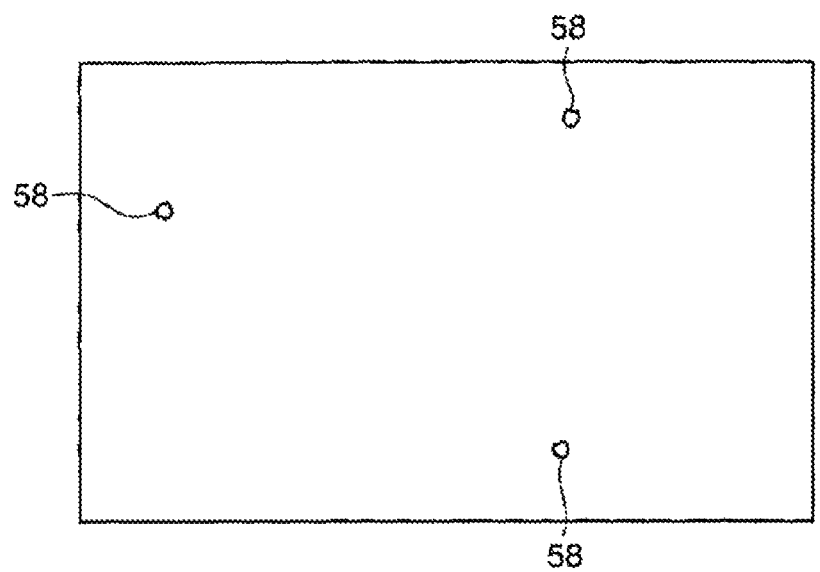
FIGS. 7A and 7B are views showing a partial process of the graphene producing method of FIG. 6.
Figure 7B:
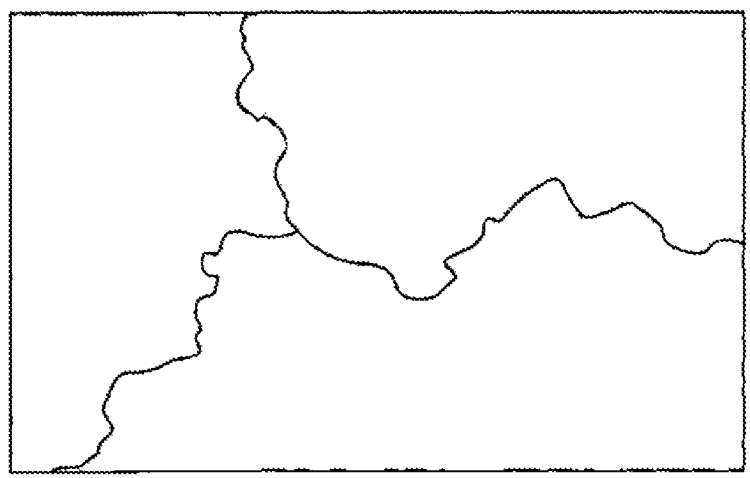

FIG. 6 is a flowchart showing the graphene producing method according to this embodiment, and FIGS. 7A and 7B are views showing a partial process of the graphene producing method of FIG. 6.

As shown in FIG. 6, the graphene producing method according to this embodiment includes: a catalytic metal activation step S61 of activating the catalytic metal layer 55 to modify the catalytic metal layer 55 into the activated catalytic metal layer 56; a low reactivity carbon-containing gas CVD step S62 of producing the graphene 57 by CVD using a low reactivity carbon-containing gas; and a high reactivity carbon-containing gas CVD step S63 of producing the graphene 57 by CVD using a high reactivity carbon-containing gas.

First, the gate valve 20 of the plasma CVD film-forming device 10 is opened and the wafer W as shown in FIG. 3A is transferred into the chamber 11 through the loading/unloading port 19. Subsequently, the wafer W is mounted on the mounting stand 12. Examples of a metal constituting the catalytic metal layer 55 of the wafer W may include a transition metal such as Cu, Fe, Co, Ni, Ru, Au, Pt or the like, or an alloy containing such a transition metal. The catalytic metal layer 55 is formed by a known film-forming technique such as a sputtering method, a vapor deposition method, a CVD method, a plating method or the like. In some embodiments, the wafer W may be a glass substrate, a plastic (polymer) substrate or the like, instead of the silicon substrate.

Subsequently, the Ar gas is introduced into the chamber 11 through the shower ring 39. The microwave generated from the microwave generating part 31 is changed into the TEM mode at the mode converter 38 and subsequently, introduced into the planar antenna 30 through the waveguide 36 and the coaxial waveguide 37. The microwave is introduced into the chamber 11 through the microwave radiation holes 29 of the planar antenna 30 and the dielectric window 32. The introduced microwave generates an argon plasma from the Ar gas, and the $H_2$ gas is introduced into the chamber 11 through the shower plate 40 according to a timing at which the argon plasma is generated so that the $H_2$ gas is excited by the argon plasma to generate a hydrogen plasma. A hydrogen plasma process in which radicals of the generated hydrogen plasma are applied onto a surface of the catalytic metal layer 55, is performed so that an oxide film (not shown) formed on the surface of the catalytic metal layer 55 is reduced to activate the catalytic metal layer 55. Thus, the catalytic metal layer 55 is modified into the activated catalytic metal layer 56 (see FIG. 3B).

In the catalytic metal activation step S61, if a temperature of the wafer W is lower than 100 degrees C., the oxide film is not sufficiently reduced on the surface of the catalytic metal layer 55, leading to insufficient activation. Meanwhile, if the temperature of the wafer W exceeds 600 degrees C., the catalytic metal layer 55 coheres, leading to increase a surface roughness of the catalytic metal layer 55. As such, in some embodiments, the temperature of the wafer W may be set to fall within a range of, e.g., from 100 to 600 degrees C., and especially, from 250 to 500 degrees C.

In some embodiments, in terms of generating a large amount of radicals in the hydrogen plasma, the internal pressure of the chamber 11 may fall within a range of, e.g., 66.7 (0.5 Torr) to 400 Pa (3 Torr), and especially, from 66.7 (0.5 Torr) to 133 Pa (1 Torr).

In some embodiments, in terms of effectively generating radicals in plasma, a flow rate of the $H_2$ gas may fall within a range of, e.g., from 100 to 2,000 mL/min (sccm), and especially, from 300 to 1,500 mL/min (sccm). Also, in terms of increasing a generation efficiency of radicals in the plasma, a flow rate of the Ar gas may fall within a range of, e.g., from 100 to 2,000 mL/min (sccm), and in some embodiments, from 300 to 1,000 mL/min (sccm).

In some embodiments, in terms of effectively generating radicals in plasma and generating a sufficient argon plasma to produce the graphene 57 at low temperatures in the low reactivity carbon-containing gas CVD step S62 following the catalytic metal activation step S61, an output value of the introduced microwave may fall within a range of, e.g., from 500 to 4,000 W, and especially, from 1,000 to 3,000 W.

In some embodiments, in terms of activating the surface of the catalytic metal layer 55 while suppressing cohesion of the catalytic metal layer 55, a process time may fall within a range of, e.g., from 1 to 15 minutes, and especially, from 5 to 10 minutes.

The introduction of the microwave is first stopped and subsequently, the supply of the $H_2$ gas is stopped such that the catalytic metal activation step S61 is completed. Further, in the catalytic metal activation step S61, as a gas for generating the hydrogen plasma, other hydrogen-containing gas such as an $NH_3$ gas may be used instead of the $H_2$ gas. Alternatively, a mixture gas of the $H_2$ gas and the $NH_3$ gas may be used.

Subsequently, in the low reactivity carbon-containing gas CVD step S62, the graphene 57 is grown only from the facets of the crystal of the activated catalytic metal layer 56, thus retraining an increase in the number of the cores 58. Specifically, after the catalytic metal activation step S61, in a state where the Ar gas is continuously introduced, the $N_2$ gas and the low reactivity hydrocarbon gas, e.g., the $C_2H_4$ gas, are introduced into the space S2 through the shower plate 40. At this time, the $N_2$ gas acts as a carrier gas.

Like the catalytic metal activation step S61, the introduced microwave generates an argon plasma from the Ar gas. The argon plasma excites and decomposes the $C_2H_4$ gas to produce a carbon plasma. Carbon radicals of the generated carbon plasma are dissolved into the activated catalytic metal layer 56 and subsequently, are recrystallized in the facets of the crystal of the activated catalytic metal layer 56, thus forming the cores 58 of the graphene 57.

Here, the $C_2H_4$ gas used as the low reactivity hydrocarbon gas has a low decomposition efficiency, making it difficult for the cores 58 of the graphene 57 to be formed in areas other than the facets of the crystal of the activated catalytic metal layer 56. Thus, in the low reactivity carbon-containing gas CVD step S62, it is possible to suppress an increase in the number of cores 58 formed on the surface of the wafer W (FIG. 7A).

While the Ar gas has been described to be continuously introduced from the catalytic metal activation step S61 to the low reactivity carbon-containing gas CVD step S62, the introduction of the Ar gas may be temporally stopped after the catalytic metal activation step S61, and another gas may be introduced to adjust, e.g., a partial pressure of the chamber 11, in the low reactivity carbon-containing gas CVD step S62.

In the low reactivity carbon-containing gas CVD step S62, in terms of realizing a low temperature process, the temperature of the wafer W may fall within a range of, e.g., from 300 to 600 degrees C., and in some embodiments, from 300 to 500 degrees C. In particular, in the graphene producing method according to the present embodiment, since an environment adapted to produce the graphene 57 is realized within the chamber 11 by performing the catalytic metal activation step S61 before performing the low reactivity carbon-containing gas CVD step S62, it is possible to form the cores 58 of the graphene 57 at a temperature of 600 degrees C. or lower, especially, at a low temperature ranging from 300 to 600 degrees C. In some embodiments, the temperature of the wafer W in the low reactivity carbon-containing gas CVD step S62 may be different from or equal to that of the wafer W in the catalytic metal activation step S61. For example, when the temperature of the wafer W in the low reactivity carbon-containing gas CVD step S62 is equal to that of the wafer W in the catalytic metal activation step S61, it is possible to increase throughput.

In some embodiments, in terms of accelerating rapid formation of the cores 58 in the facets, the internal pressure of the chamber 11 may fall within a range of, e.g., from 66.7 (0.5 Torr) to 667 Pa (5 Torr), and especially, from 400 (3 Torr) to 667 Pa (5 Torr).

In some embodiments, in terms of rapidly forming the cores 58, a flow rate of the $C_2H_4$ gas may fall within a range of, e.g., from 5 to 200 mL/min (sccm), and especially, from 6 to 30 mL/min (sccm).

Also, by introducing the Ar gas, as well as the $N_2$ gas, together with the $C_2H_4$ gas, into the chamber 11, it is possible to accelerate the plasma process of the $C_2H_4$ gas, thus increasing a formation speed of the cores 58 and enhancing quality. However, the use of the Ar gas and the $N_2$ gas is not essential. When the Ar gas is introduced, in terms of rapidly forming the cores 58, a flow rate of the Ar gas may fall within a range of, e.g., from 100 to 2,000 mL/min (sccm), and in some embodiments, from 300 to 1,000 mL/min (sccm). Also, when the $N_2$ gas is introduced, in terms of rapidly forming the cores 58, a flow rate of the $N_2$ gas may fall within a range of, e.g., from 100 to 1,000 mL/min (sccm), and in some embodiments, from 100 to 300 mL/min (sccm).

In some embodiments, in terms of restraining an increase in the number of cores 58 while accelerating the formation of the cores 58, a process time may fall within a range of, e.g., from 1 to 120 minutes, and especially, from 1 to 15 minutes.

In the low reactivity carbon-containing gas CVD step S62, the low reactivity carbon-containing gas is not limited to the $C_2H_4$ gas (an ethylene gas). In some embodiments, another hydrocarbon gas such as a chain-type saturated hydrocarbon gas (e.g., a methane gas, an ethane gas, or a propane gas), a chain-type unsaturated hydrocarbon (double bond) gas (e.g., a propylene gas), a cyclic hydrocarbon gas, or an aromatic hydrocarbon gas may be used instead of the $C_2H_4$ gas. Alternatively, a gas of phenols, a gas of alcohols or a gas of ethers may also be used instead of the $C_2H_4$ gas.

Further, in the low reactivity carbon-containing gas CVD step S62, the cores 58 of the graphene 57 has been described to be formed by generating the carbon plasma from the $C_2H_4$ gas through the plasma CVD method performed by the plasma CVD film-forming device 10. However, since the plasma CVD film-forming device 10 can use the thermal CVD method, in some embodiments, the thermal CVD method may be used in the low reactivity carbon-containing gas CVD step S62. Specifically, the $C_2H_4$ gas is thermally decomposed by heat radiated from the heater 23 and the catalytic action of the activated catalytic metal layer 56. The cores 58 of the graphene 57 may be formed using carbon atoms generated through the thermal decomposition.

Subsequently, in the high reactivity carbon-containing gas CVD step S63, the graphene 57 is grown from each of the cores 58 in a short period of time. Specifically, while continuously introducing the Ar gas even after the low reactivity carbon-containing gas CVD step S62, the $N_2$ gas and the high reactivity hydrocarbon gas, e.g., the $C_2H_2$ gas, are introduced into the chamber 11 through the shower plate 40. Also, at this time, the $N_2$ gas acts as a carrier gas.

Also, the $C_2H_s$ gas is thermally decomposed by the heat radiated from the heater 23 and the catalytic action of the activated catalytic metal layer 56, thus generating carbon atoms. The generated carbon atoms are dissolved into the activated catalytic metal layer 56 and subsequently, are recrystallized in the cores 58 of the graphene 57 on the surface of the activated catalytic metal layer 56. Here, since the $C_2H_2$ gas used as the high reactivity hydrocarbon gas has a high decomposition efficiency, the graphene 57 is rapidly grown. This shortens a period of time during which the graphene 57 is heated by the heater 23 or the like, preventing an amount of heat applied to the graphene 57 from being increased to be more than necessary and restraining an increase in the surface roughness of the graphene 57. As a result, it is possible to secure the expansion space of each of the domains 59 of the graphene 57, which grow from the respective cores 58 of the decreased number, thus increasing a size of each of the domains 59 (FIG. 7B).

In the high reactivity carbon-containing gas CVD step S63, the plasma CVD film-forming device 10 serves as a thermal CVD device which forms the graphene 57 through the thermal CVD method. Further, while the Ar gas has been described to be continuously introduced from the catalytic metal activation step S61 to the high reactivity carbon-containing gas CVD step S63, the introduction of the Ar gas may be temporally stopped after the low reactivity carbon-containing gas CVD step S62, and another gas may be introduced to adjust, e.g., a partial pressure of the chamber 11, in the high reactivity carbon-containing gas CVD step S63.

In some embodiments, in the high reactivity carbon-containing gas CVD step S63, a temperature of the wafer W may fall within a range of, e.g., from 300 to 600 degrees C., and especially, from 300 to 500 degrees C., in terms of increasing the decomposition efficiency of the $C_2H_2$ gas to accelerate the growth of the graphene 57. In some embodiments, the temperature of the wafer W in the high reactivity carbon-containing gas CVD step S63 may be different from or equal to that of the wafer W in the low reactivity carbon-containing gas CVD step S62. For example, when the temperature of the wafer W in the high reactivity carbon-containing gas CVD step S63 is equal to that of the wafer W in the low reactivity carbon-containing gas CVD step S62, it is possible to increase throughput.

Further, in some embodiments, the internal pressure of the chamber 11 may fall within a range of, e.g., from 66.7 (0.5 Torr) to 667 Pa (5 Torr), and especially, from 400 (3 Torr) to 667 Pa (5 Torr), in terms of maintaining a sufficient growth rate of the graphene 57.

In some embodiments, a flow rate of the $C_2H_2$ gas may fall within a range of, e.g., from 1 to 200 mL/min (sccm), and especially, from 1 to 30 mL/min (sccm), in terms of rapidly growing the graphene 57.

Further, by introducing the Ar gas, as well as the $N_2$ gas, together with the $C_2H_2$ gas, into the chamber 11, it is possible to accelerate a growth speed of the graphene 57 and realize an enhanced quality. However, even in the high reactivity carbon-containing gas CVD step S63, the use of the Ar gas and the $N_2$ gas is not essential. When the Ar gas is introduced, in terms of rapidly growing the graphene 57, a flow rate of the Ar gas may fall within a range of, e.g., from 100 to 2,000 mL/min (sccm), and especially, from 300 to 1,000 mL/min (sccm). Also, when the $N_2$ gas is introduced, a flow rate thereof may fall within a range of, e.g., from 100 to 1,000 mL/min (sccm), and especially, from 100 to 300 mL/min (sccm), in terms of rapidly growing the graphene 57.

A process time may fall within a range of, e.g., from 1 to 120 minutes, and especially, from 1 to 15 minutes, in terms of preventing an amount of heat applied to the graphene 57 from being increased over the limit, while sufficiently growing the graphene 57.

In the high reactivity carbon-containing gas CVD step S63, the $C_2H_2$ gas has been described to be used as the high reactivity carbon-containing gas, but is not limited thereto. In some embodiments, an acetylene gas may be used as the high reactivity carbon-containing gas.

Further, in the high reactivity carbon-containing gas CVD step S63, since plasma is not generated, the graphene 57 does not suffer from any damage that may be caused by electrons or ions in the plasma. In addition, it is possible to suppress the generation of crystal defects or the introduction of impurities, thus forming the graphene 57 which is low in impurity content and good in crystallinity.

In the high reactivity carbon-containing gas CVD step S63, the plasma CVD film-forming device 10 thermally decomposes the $C_2H_2$ gas using the thermal CVD method to grow the graphene 57. Further, the plasma CVD film-forming device 10 can employ the plasma CVD method, thus employing the plasma CVD method even in the high reactivity carbon-containing gas CVD step S63. Specifically, the carbon plasma may be generated from the $C_2H_2$ gas by microwave so that the graphene 57 is grown by the generated carbon plasma.

Further, in the low reactivity carbon-containing gas CVD step S62 or the high reactivity carbon-containing gas CVD step S63, another noble gas, e.g., He, Ne, Kr, or Xe gas, may be used instead of the Ar gas. Further, in addition to the carbon-containing gas, for example, a reduction gas such as $H_2$ or $NH_3$, or an oxidizing gas such as $O_2$, $O_3$, $H_2O$, or $N_2O$ may be simultaneously introduced into the chamber 11.

Subsequently, after the graphene 57 including the domains 59 having a large size is produced, the introduction of microwaves is stopped, and the supply of the $C_2H_2$ gas, the $N_2$ gas, or the Ar gas is stopped. Thereafter, the internal pressure of the chamber 11 is adjusted and subsequently, the gate valve 20 is opened to unload the wafer W from the chamber 11. In this way, the graphene producing method is terminated.

According to the graphene producing method of FIG. 6, first, the $C_2H_4$ gas as the low reactivity hydrocarbon gas having a low decomposition efficiency is used so that an increase in number of the cores 58 of the graphene 57, which are formed on the surface of the wafer W, is decreased. Subsequently, the $C_2H_2$ gas as the high reactivity hydrocarbon gas having a high decomposition efficiency is used so that the graphene 57 is grown from the cores 58 of the decreased number in a short period of time. As a result, it is possible to increase the size of each of the domains 59 of the graphene 57.

In the graphene producing method of FIG. 6 as described above, the catalytic metal layer 55 formed on the wafer W is activated and modified into the activated catalytic metal layer 56, which makes it possible to reliably dissolve the carbon radicals or the carbon atoms decomposed from the $C_2H_4$ gas or the $C_2H_2$ gas and put the same into the activated catalytic metal layer 56.

Although the present disclosure has been described using the above embodiments, the present disclosure is not limited thereto.

While in the graphene producing method of FIG. 6 as described above, the catalytic metal layer 55 has been described to be activated and modified into the activated catalytic metal layer 56 before the catalytic metal activation step S61 or the low reactivity carbon-containing gas CVD step S62, the present disclosure is not limited thereto. As an example, in the presence of facets in crystal of the catalytic metal, the graphene 57 is grown from the formed cores 58, which eliminates a need to activate the catalytic metal layer 55.

Further, while in the graphene producing method of FIG. 6 as described above, the catalytic metal activation step S61 to the high reactivity carbon-containing gas CVD step S63 has been described to be performed in the same plasma CVD film-forming device 10, the present disclosure is not limited thereto. In some embodiments, the catalytic metal activation step S61 to the high reactivity carbon-containing gas CVD step S63 may be performed in different plasma CVD film-forming devices.

What is claimed is:

1. A graphene producing method, comprising:
   activating a catalytic metal layer formed on a substrate;
   supplying and decomposing a low reactivity carbon-containing gas in a space that faces the substrate; and
   supplying and decomposing a high reactivity carbon-containing gas different from the low reactivity carbon-containing gas, after supplying and decomposing the low reactivity carbon containing gas, in the space that faces the substrate,
   wherein the low reactivity carbon-containing gas includes at least one of an ethylene gas (a C2H4 gas), a methane gas, an ethane gas, or a propane gas, a propylene gas, a cyclic hydrocarbon gas, an aromatic hydrocarbon gas, a phenol, an alcohol, and ether, and
   wherein the high reactivity carbon-containing gas includes at least an acetylene gas (a $C_2H_2$ gas).

2. The method of claim 1, wherein, in supplying and decomposing the low reactivity carbon-containing gas, the low reactivity carbon-containing gas is decomposed by plasma.

3. The method of claim 1, wherein, in supplying and decomposing the high reactivity carbon-containing gas, the high reactivity carbon-containing gas is decomposed by heat.

4. The method of claim 1, wherein the temperature of the substrate is between 300 degrees C. and 500 degrees C. in supplying and decomposing the low reactivity carbon-containing gas and in supplying and decomposing the high reactivity carbon-containing gas.

* * * * *